United States Patent
Lin et al.

(10) Patent No.: US 10,819,300 B2
(45) Date of Patent: Oct. 27, 2020

(54) ANALOG MICROPHONE AND CONTROL METHOD THEREOF TECHNICAL FIELD OF THE DISCLOSURE

(71) Applicant: Silicon Integrated Systems Corp, Hsinchu (TW)

(72) Inventors: Wen-Chi Lin, Hsinchu (TW); Ssu-Che Yang, Hsinchu (TW); Keng-Nan Chen, Hsinchu (TW)

(73) Assignee: SILICON INTEGRATED SYSTEMS CORP, Hsinchu (TW)

( * ) Notice: Subject to any disclaimer, the term of this patent is extended or adjusted under 35 U.S.C. 154(b) by 0 days.

(21) Appl. No.: 16/393,363

(22) Filed: Apr. 24, 2019

(65) Prior Publication Data

US 2019/0326868 A1    Oct. 24, 2019

(30) Foreign Application Priority Data

Apr. 24, 2018   (TW) ............................. 107114150 A

(51) Int. Cl.
*H03G 3/30* (2006.01)
*H03F 3/45* (2006.01)
*H04R 3/00* (2006.01)

(52) U.S. Cl.
CPC ....... *H03G 3/3005* (2013.01); *H03F 3/45071* (2013.01); *H04R 3/00* (2013.01); *H03F 2200/03* (2013.01); *H03F 2200/129* (2013.01); *H03F 2203/45528* (2013.01)

(58) Field of Classification Search
CPC combination set(s) only.
See application file for complete search history.

(56) References Cited

U.S. PATENT DOCUMENTS

| | | | | |
|---|---|---|---|---|
| 2011/0150243 | A1* | 6/2011 | Onishi | H02M 3/07 381/111 |
| 2013/0039505 | A1* | 2/2013 | Kawano | H04B 1/1036 381/71.1 |
| 2013/0271307 | A1* | 10/2013 | Kropfitsch | H03G 3/3005 341/158 |
| 2015/0110295 | A1* | 4/2015 | Jenkner | H04R 1/08 381/114 |

* cited by examiner

*Primary Examiner* — Duc Nguyen
*Assistant Examiner* — Assad Mohammed
(74) *Attorney, Agent, or Firm* — Muncy, Geissler, Olds & Lowe, P.C.

(57) ABSTRACT

An analog microphone and a control method thereof are disclosed. The analog microphone includes a sensor configured to sense an audio signal and convert the audio signal into an electrical signal; a charge pump configured to provide a bias voltage for the sensor to drive the sensor; a source follower configured to receive the electrical signal and convert the electrical signal into a source follower signal; a gain adjustable amplifier configured to receive the source follower signal, multiply the source follower signal by an amplifying factor, and output an amplified signal; and a detecting module configured to adaptively control the bias voltage of the charge pump and the amplified signal of the gain adjustable amplifier in response to the source follower signal of the source follower.

6 Claims, 4 Drawing Sheets

ANALOG MICROPHONE AND CONTROL METHOD THEREOF TECHNICAL FIELD OF THE DISCLOSURE

TECHNICAL FIELD OF THE DISCLOSURE

The present disclosure relates to a technological field of microphones, and more particularly to an analog microphone and a control method thereof.

BACKGROUND OF THE DISCLOSURE

In an analog microphone, a sensor is configured to sense an audio signal. A gain amplifier is configured to adjust the audio signal and output the adjusted audio signal after a source follower (SF) reads the audio signal.

An acoustic overload point (AOP) is an important parameter of the analog microphone. The acoustic overload point refers to a maximum sound pressure level (SPL) which can be detected when a total harmonic distortion (THD) of an output signal of the analog microphone is smaller than 10%. When an input signal is greater than the acoustic overload point, the output signal is distorted seriously.

However, in the conventional analog microphone, a linearity of the source follower is poor, and thus the acoustic overload point cannot be increased effectively.

Therefore, there is a need to solve the above-mentioned problems in the prior art.

SUMMARY OF THE DISCLOSURE

An objective of the present disclosure is to provide an analog microphone and a control method thereof capable of solving the problems in the prior art.

The analog microphone of the present disclosure includes a sensor configured to sense an audio signal and convert the audio signal into an electrical signal; a charge pump electrically coupled to the sensor, and the charge pump configured to provide a bias voltage for the sensor to drive the sensor; a source follower electrically coupled to the sensor, and the source follower configured to receive the electrical signal and convert the electrical signal into a source follower signal; a gain adjustable amplifier electrically coupled to the source follower, and the gain adjustable amplifier configured to receive the source follower signal, multiply the source follower signal by an amplifying factor, and output an amplified signal; and a detecting module electrically coupled to the charge pump, the source follower and the gain adjustable amplifier, and the detecting module configured to adaptively control the bias voltage of the charge pump and the amplified signal of the gain adjustable amplifier in response to the source follower signal of the source follower.

In the control method of the analog microphone of the present disclosure, the analog microphone includes a sensor, a charge pump, a source follower, a gain adjustable amplifier and a detecting module. The control method of the analog microphone includes providing a bias voltage for the sensor to drive the sensor by the charge pump; sensing an audio signal and converting the audio signal into an electrical signal by the sensor; receiving the electrical signal and converting the electrical signal into a source follower signal by the source follower; receiving the source follower signal, multiplying the source follower signal by an amplifying factor, and outputting an amplified signal by the gain adjustable amplifier; and adaptively controlling, by the detecting module, the bias voltage of the charge pump and the amplified signal of the gain adjustable amplifier in response to the source follower signal of the source follower.

The analog microphone and the control method thereof in accordance with the present disclosure can increase the acoustic overload point effectively by solving the problem of the poor linearity of the source follower in a situation that the amplified signal outputted by the gain adjustable amplifier remains unchanged.

DETAILED DESCRIPTION OF THE DISCLOSURE

To make the objectives, technical schemes, and technical effects of the present disclosure more clearly and definitely, the present disclosure will be described in details below by using embodiments in conjunction with the appending drawings. It should be understood that the specific embodiments described herein are merely for explaining the present disclosure, and as used herein, the term "embodiment" refers to an instance, an example, or an illustration but is not intended to limit the present disclosure. In addition, the articles "a" and "an" as used in the specification and the appended claims should generally be construed to mean "one or more" unless specified otherwise or clear from the context to be directed to a singular form. Also, in the appending drawings, the components having similar or the same structure or function are indicated by the same reference number.

Figure 1:
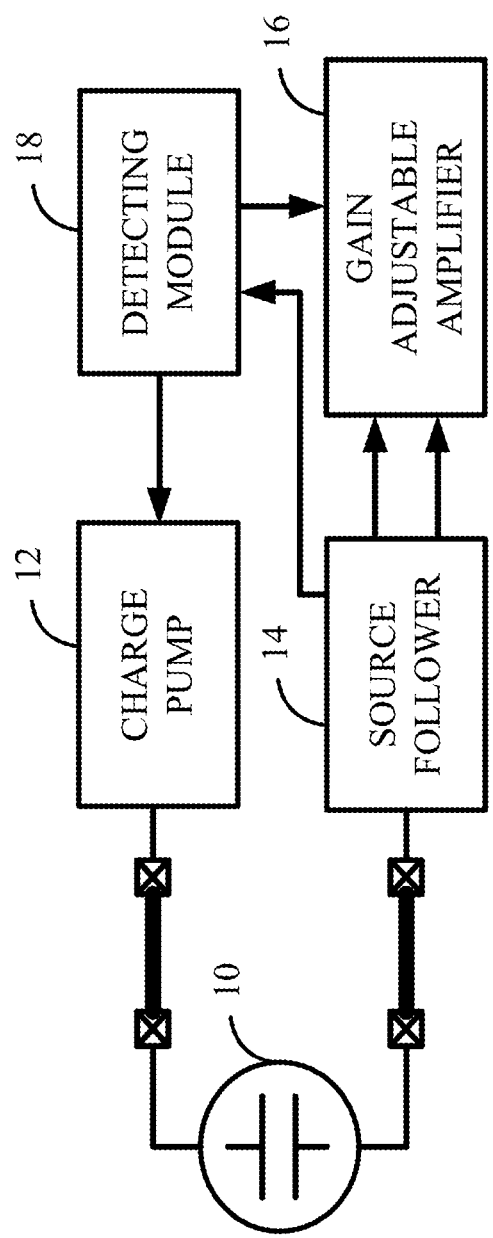
FIG. 1 illustrates a block diagram of an analog microphone in accordance with an embodiment of the present disclosure.

Please refer to FIG. 1. FIG. 1 illustrates a block diagram of an analog microphone in accordance with an embodiment of the present disclosure.

The analog microphone may be a micro electro mechanical system (MEMS) microphone. The analog microphone includes a sensor 10, a charge pump 12, a source follower (SF) 14, a gain adjustable amplifier 16 and a detecting module 18.

The sensor 10 configured to sense an audio signal and convert the audio signal into an electrical signal.

The charge pump 12 is electrically coupled to the sensor 10. The charge pump 12 is configured to provide a bias voltage for the sensor 10 to drive the sensor 10.

The source follower 14 is electrically coupled to the sensor 10. The source follower 14 is configured to receive the electrical signal and convert the electrical signal into a source follower signal. In detail, the source follower 14 serves as an impedance matching component to read out the electrical signal of the sensor 10.

The gain adjustable amplifier 16 is electrically coupled to the source follower 14. The gain adjustable amplifier 16 is configured to receive the source follower signal, multiply the source follower signal by an amplifying factor, and output an amplified signal. In one embodiment, the gain adjustable amplifier 16 may be a programmable gain amplifier (PGA).

The detecting module 18 is electrically coupled to the charge pump 12, the source follower 14 and the gain adjustable amplifier. The detecting module is configured to adaptively control an output (i.e., the bias voltage) of the charge pump 12 and an output (i.e., the amplified signal) of the gain adjustable amplifier 16 in response to the source follower signal of the source follower 14.

Because a linearity of the source follower 14 is poor, an acoustic overload point (AOP) cannot be increased effectively. A feature of the present disclosure is that the detecting module 18 controls the charge pump 12 to decrease the bias voltage provided for the sensor 10 and controls the gain adjustable amplifier 16 to increase the amplifying factor when the detecting module 18 detects that an amplitude of the source follower signal is greater than a threshold value. A degree of controlling the charge pump 12 to decrease the bias voltage by the detecting module 18 is directly proportional to the amplifying factor which the detecting module 18 controls the gain adjustable amplifier 16 to increase. That is, when the bias voltage is decreased less, the amplifying factor is increased less. When the bias voltage is decreased more, the amplifying factor is increased more. It is noted that a relationship between the degree of decreasing the bias voltage and the increasing of the amplifying factor can be measured in advance.

The threshold value is a maximum amplitude of an input signal (i.e., the electrical signal) which can be inputted to the source follower 14 when a total harmonic distortion (THD) of an output signal (i.e., the amplified signal) of the analog microphone is smaller than 10%.

When the detecting module 18 controls the charge pump 12 to decrease the bias voltage provided for the sensor 10, sensitivity of the sensor 10 can be decreased. Because the bias voltage of the sensor 10 is decreased, the electrical signal outputted by the sensor 10 is decreased and the source follower signal outputted by the source follower 14 is decreased. Because the source follower signal outputted by the source follower 14 is decreased, effect of the poor linearity of the source follower 14 can be decreased significantly. Although the source follower signal outputted by the source follower 14 is decreased, the amplified signal outputted by the gain adjustable amplifier 16 can remain unchanged by increasing the amplifying factor used for amplify the source follower signal.

In one embodiment, the detecting module 18 may be a comparator. The comparator can detect whether the amplitude of the source follower signal is greater than the threshold value.

Accordingly, the analog microphone of the present disclosure can increase the acoustic overload point effectively by solving the problem of the poor linearity of the source follower 14 in a situation that the amplified signal outputted by the gain adjustable amplifier 16 remains unchanged.

Figure 2:
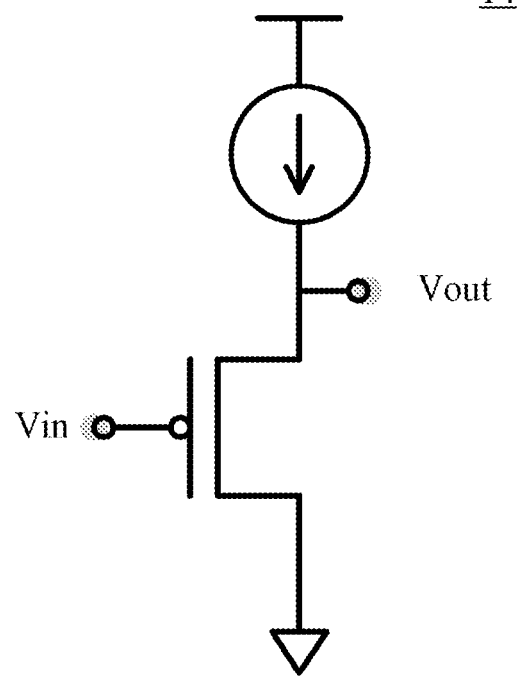
FIG. 2 illustrates a circuit diagram of a source follower in accordance with an embodiment of the present disclosure.
Figure 3:
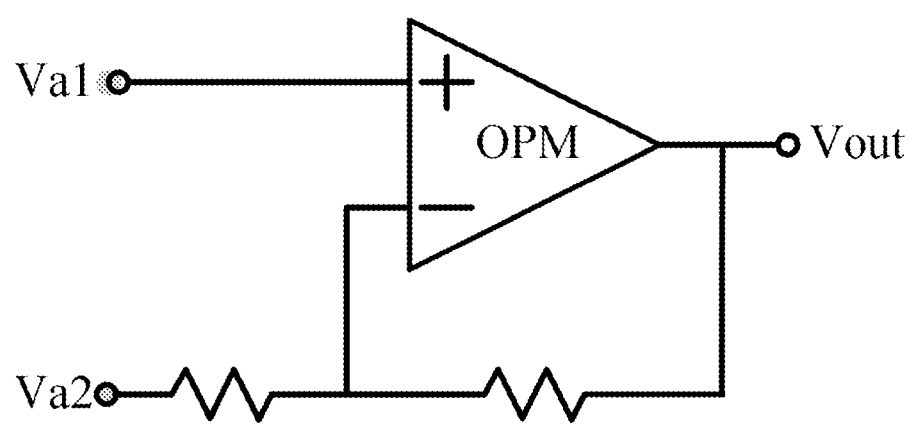
FIG. 3 illustrates a circuit diagram of a gain adjustable amplifier in accordance with an embodiment of the present disclosure.

Please refer to FIG. 2 and FIG. 3. FIG. 2 illustrates a circuit diagram of the source follower 14 in accordance with an embodiment of the present disclosure. FIG. 3 illustrates a circuit diagram of the gain adjustable amplifier 16 in accordance with an embodiment of the present disclosure.

Figure 4:
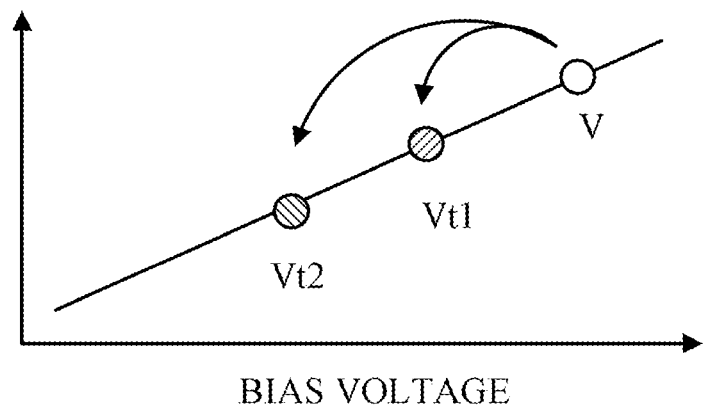
FIG. 4 illustrates a relationship between a bias voltage and a sensitivity in accordance with an embodiment of the present disclosure.
Figure 5:
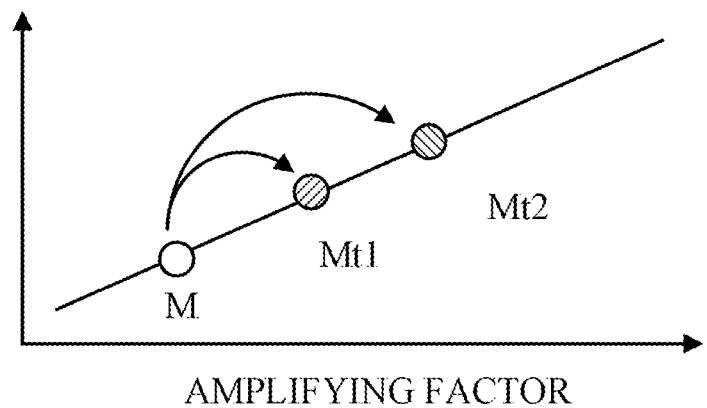
FIG. 5 illustrates a relationship between an amplifying factor and the sensitivity in accordance with an embodiment of the present disclosure.

Please refer to FIG. 1, FIG. 4 and FIG. 5. FIG. 4 illustrates a relationship between the bias voltage and the sensitivity in accordance with an embodiment of the present disclosure. FIG. 5 illustrates a relationship between the amplifying factor and the sensitivity in accordance with an embodiment of the present disclosure.

As mentioned above, the degree of controlling the charge pump 12 to decrease the bias voltage by the detecting module 18 is directly proportional to the amplifying factor which the detecting module 18 controls the gain adjustable amplifier 16 to increase. That is, when the bias voltage in FIG. 4 is decreased less (from V to Vt1), the amplifying factor in FIG. 5 is increased less (from M to Mt1). When the bias voltage in FIG. 4 is decreased more (from V to Vt2), the amplifying factor in FIG. 5 is increased more (from M to Mt2).

Figure 6:
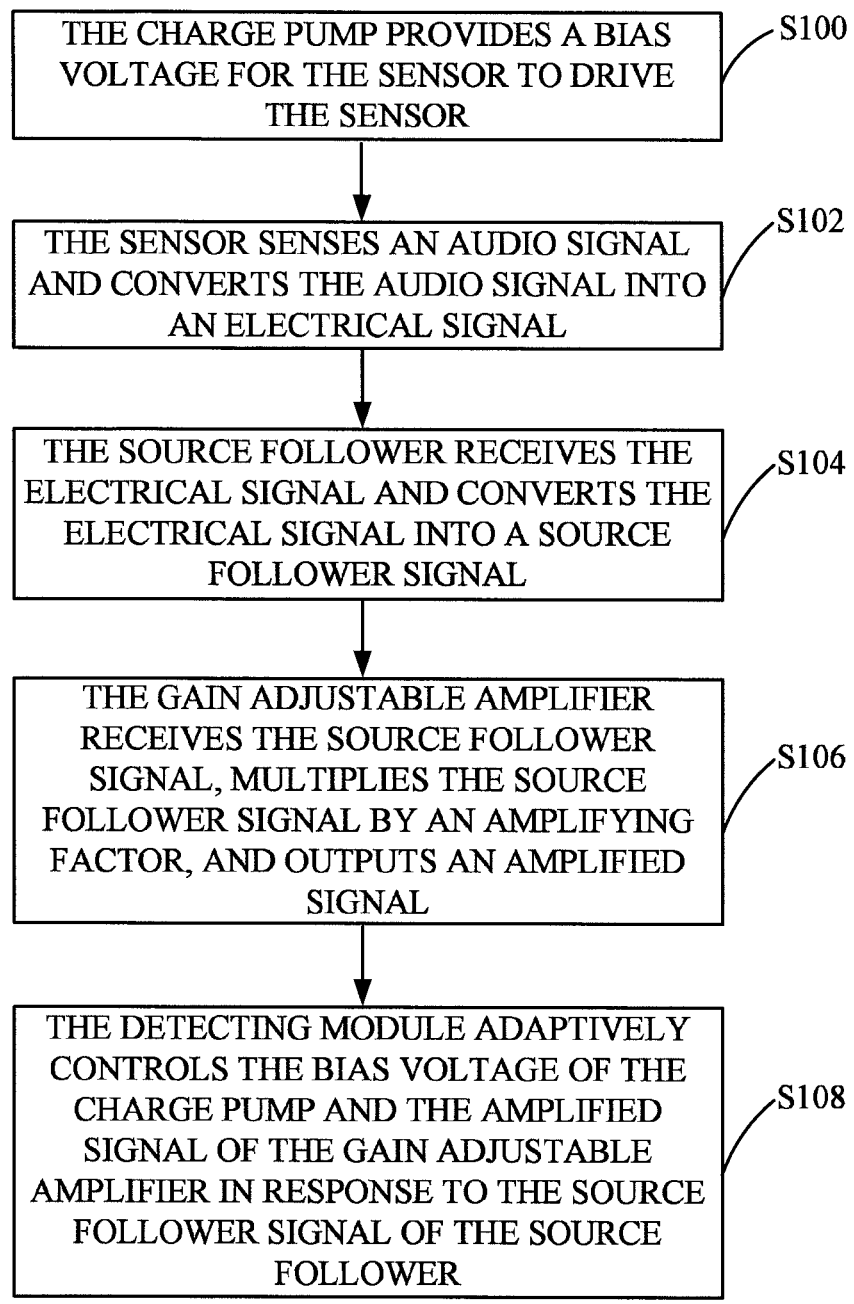
FIG. 6 illustrates a control method of an analog microphone in accordance with an embodiment of the present disclosure.

Please refer to FIG. 6. FIG. 6 illustrates a control method of an analog microphone in accordance with an embodiment of the present disclosure.

The analog microphone includes a sensor, a charge pump, a source follower, a gain adjustable amplifier and a detecting module.

In block S100, the charge pump provides a bias voltage for the sensor to drive the sensor.

In block S102, the sensor senses an audio signal and converts the audio signal into an electrical signal.

In block S104, the source follower receives the electrical signal and converts the electrical signal into a source follower signal.

In block S106, the gain adjustable amplifier receives the source follower signal, multiplies the source follower signal by an amplifying factor, and outputs an amplified signal.

In block S108, the detecting module adaptively controls the bias voltage of the charge pump and the amplified signal of the gain adjustable amplifier in response to the source follower signal of the source follower.

In one embodiment, the detecting module controls the charge pump to decrease the bias voltage provided for the sensor and controls the gain adjustable amplifier to increase the amplifying factor when the detecting module detects that an amplitude of the source follower signal is greater than a threshold value. A degree of controlling the charge pump to decrease the bias voltage by the detecting module is directly proportional to the amplifying factor which the detecting module controls the gain adjustable amplifier to increase.

The threshold value is a maximum amplitude of the electrical signal which can be inputted to the source follower when a total harmonic distortion of the amplified signal of the analog microphone is smaller than 10%.

In one embodiment, the detecting module is a comparator.

The analog microphone and the control method thereof in accordance with the present disclosure can increase the acoustic overload point effectively by solving the problem of the poor linearity of the source follower in a situation that the amplified signal outputted by the gain adjustable amplifier remains unchanged.

While the preferred embodiments of the present disclosure have been illustrated and described in detail, various modifications and alterations can be made by persons skilled in this art. The embodiment of the present disclosure is therefore described in an illustrative but not restrictive sense. It is intended that the present disclosure should not be limited to the particular forms as illustrated, and that all modifications and alterations which maintain the spirit and realm of the present disclosure are within the scope as defined in the appended claims.

What is claimed is:

1. An analog microphone, comprising:
a sensor configured to sense an audio signal and convert the audio signal into an electrical signal;
a charge pump electrically coupled to the sensor, and the charge pump configured to provide a bias voltage for the sensor to drive the sensor;
a source follower electrically coupled to the sensor, and the source follower configured to receive the electrical signal and convert the electrical signal into a source follower signal;
a gain adjustable amplifier electrically coupled to the source follower, and the gain adjustable amplifier configured to receive the source follower signal, multiply the source follower signal by an amplifying factor, and output an amplified signal; and
a detecting module electrically coupled to the charge pump, the source follower and the gain adjustable amplifier, and the detecting module configured to adaptively control the bias voltage of the charge pump and the amplified signal of the gain adjustable amplifier in response to the source follower signal of the source follower;
wherein the detecting module controls the charge pump to decrease the bias voltage provided for the sensor and controls the gain adjustable amplifier to increase the amplifying factor when the detecting module detects that an amplitude of the source follower signal is greater than a threshold value,
wherein the threshold value is a maximum amplitude of the electrical signal which can be inputted to the source follower when a total harmonic distortion of the amplified signal is smaller than 10%.

2. The analog microphone according to claim 1, wherein a degree of controlling the charge pump to decrease the bias voltage by the detecting module is directly proportional to the amplifying factor which the detecting module controls the gain adjustable amplifier to increase.

3. The analog microphone according to claim 1, wherein the detecting module is a comparator.

4. A control method of an analog microphone, the analog microphone comprising a sensor, a charge pump, a source follower, a gain adjustable amplifier and a detecting module, and the control method of the analog microphone comprising:
providing a bias voltage for the sensor to drive the sensor by the charge pump;
sensing an audio signal and converting the audio signal into an electrical signal by the sensor;
receiving the electrical signal and converting the electrical signal into a source follower signal by the source follower;
receiving the source follower signal, multiplying the source follower signal by an amplifying factor, and outputting an amplified signal by the gain adjustable amplifier; and
adaptively controlling, by the detecting module, the bias voltage of the charge pump and the amplified signal of the gain adjustable amplifier in response to the source follower signal of the source follower;
wherein the step of adaptively controlling, by the detecting module, the bias voltage of the charge pump and the amplified signal of the gain adjustable amplifier in response to the source follower signal of the source follower comprises:
controlling, by the detecting module, the charge pump to decrease the bias voltage provided for the sensor and controlling, by the detecting module, the gain adjustable amplifier to increase the amplifying factor, when the detecting module detects that an amplitude of the source follower signal is greater than a threshold value,
wherein the threshold value is a maximum amplitude of the electrical signal which can be inputted to the source follower when a total harmonic distortion of the amplified signal is smaller than 10%.

5. The control method of the analog microphone according to claim 4, wherein a degree of controlling the charge pump to decrease the bias voltage by the detecting module is directly proportional to the amplifying factor which the detecting module controls the gain adjustable amplifier to increase.

6. The control method of the analog microphone according to claim 4, wherein the detecting module is a comparator.

* * * * *